United States Patent [19]

Nicklaus et al.

[11] 4,069,961
[45] Jan. 24, 1978

[54] CONTACTING HEAD FOR FORMING A WIRE CONNECTION ON AN INTEGRATED CIRCUIT

[75] Inventors: Karl Nicklaus, Steinhausen; Miroslav Tresky, Thalwil, both of Switzerland

[73] Assignee: Esec Sales S.A., Zug, Switzerland

[21] Appl. No.: 750,896

[22] Filed: Dec. 15, 1976

[30] Foreign Application Priority Data

Dec. 23, 1975 Switzerland ............... 16751/75

[51] Int. Cl.² ............... B23K 21/02; H01L 21/607
[52] U.S. Cl. ............... 228/1 R; 226/97; 228/4.5
[58] Field of Search ............... 228/1 R, 4.5; 226/95, 226/97

[56] References Cited

U.S. PATENT DOCUMENTS

| | | | |
|---|---|---|---|
| 3,342,396 | 9/1967 | Miller | 228/4.5 |
| 3,643,321 | 2/1972 | Field et al. | 228/4.5 X |
| 3,672,556 | 6/1972 | Diepeveen | 228/4.5 X |
| 3,776,447 | 12/1973 | Adams et al. | 228/4.5 |
| 4,019,669 | 4/1977 | Tanimoto et al. | 228/4.5 |

*Primary Examiner*—Donald G. Kelly
*Assistant Examiner*—K. J. Ramsey

*Attorney, Agent, or Firm*—Haseltine, Lake & Waters

[57] ABSTRACT

A contacting head for making a wire connection, particularly an aluminum or gold wire connection on an integrated circuit by ultrasonic or thermocompression bonding, in which a contacting arm is provided with a concave contacting tool or a capillary, and supplies ultrasonic or heat energy. The concave contacting tool has a gripper, or the capillary has a wire clamping device for effecting a feed or clamping of the wire during movement of the contacting arm. A driving unit provides for threading the wire through a wire guiding device which is entirely enclosed, and through the concave contacting tool or the capillary. The driving unit also provides for controlling the wire tension and produces a gas stream in the enclosed wire guiding device. A magnetic arrangement with a permanent magnet and a non-ferrous core provides for electrodynamic contact pressure control of the contacting arm and for control of the gripper. The wire supply spool is encapsulated and mounted on a base, together with a housing which is vertically movable on the base and mounts the contacting arm, the driving unit and the gripper or wire clamping device. The wire guiding device connects the wire supply spool to the driving unit, and is in the form of an elastic metal tube for the wire.

13 Claims, 8 Drawing Figures

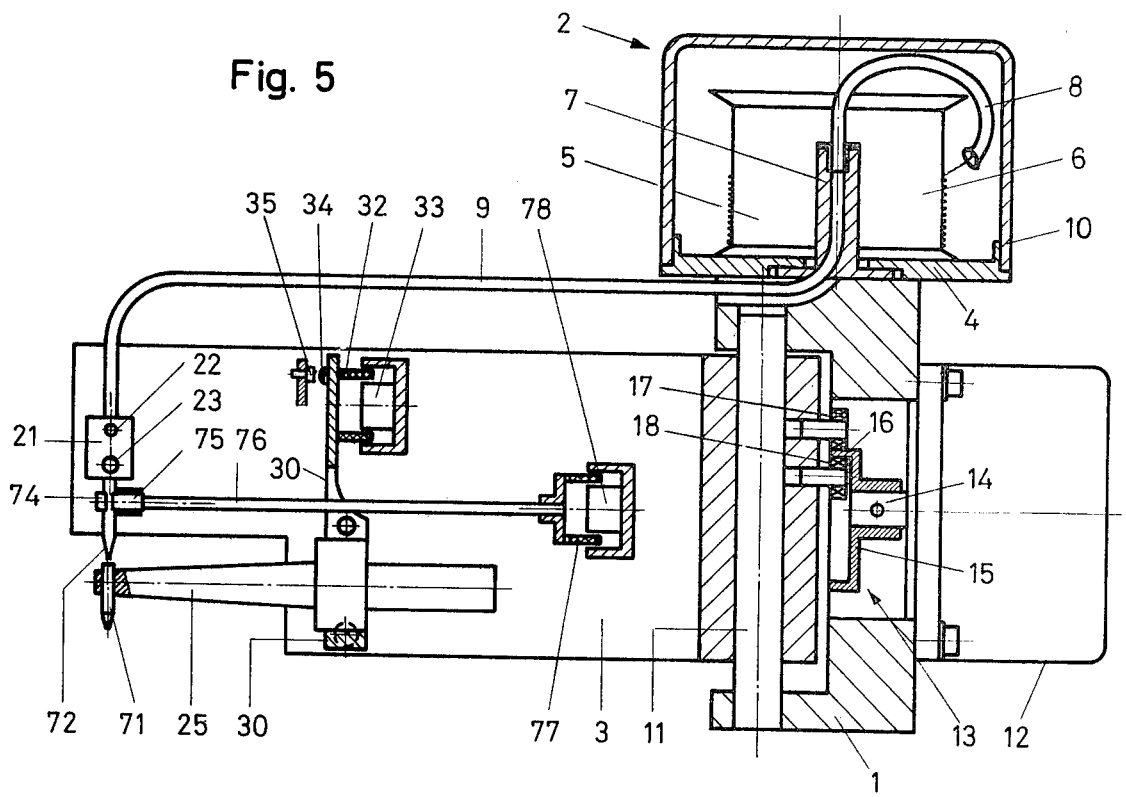
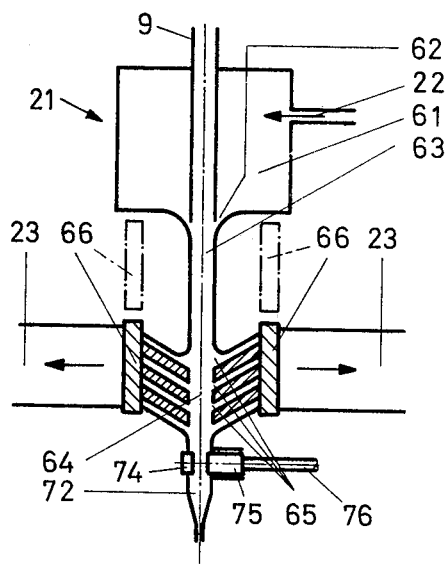

CONTACTING HEAD FOR FORMING A WIRE CONNECTION ON AN INTEGRATED CIRCUIT

FIELD OF THE INVENTION

The present invention relates to a contacting head for the making of a wire bond or connection, particularly an aluminum or gold wire connection, on an integrated circuit or microcircuit by means of ultrasonics or thermocompression, with an encapsulated wire supply spool, with a wire guiding device and with a contacting arm or horn which has provision for supplying ultrasonic or heat energy; the concave contacting tool has a gripper arrangement, or the capillary has a wire clamping device, for effecting a feed or a clamping of the wire during movement of the contacting arm or horn.

PRIOR ART

With conventional contacting devices having a contacting head, the contacting wire must be manually threaded through various parts of the device and thus it is only partially covered and guided. During operation, the wire is either unwound from a fixed supply spool (bobbin) in its axial direction or from a driven, rotating supply spool in the tangential direction. The control of the wire tension between the spool and the operating point is achieved by mechanical friction between the fixed parts and the wire by means of the spool drive. To the extent that with the conventional devices, the forces and speeds of various moving contacting units of the contacting head, for example of the contacting horn, the wire clamping device and the gripper device are controllable and programmable, electromagnets with wound iron cores are used as energizing elements.

With such conventional contacting devices, it is a disadvantage that the manual threading of the wire, particularly when it is very thin, is very cumbersome, and that the control of the wire tension is either inadequate or very complex. Since the wire is not protected and guided, or only partially so, the contacting tool or the capillary are soiled and there is formation of untensioned wire sections. In devices having a driven wire supply spool, the design of such a spool is complicated and very expensive. Another disadvantage is that all of the aforementioned contacting units of the contacting head are not controllable and programmable and that the electromagnets with an iron core used as energizing elements work relatively slow and not linearly. A final disadvantage of the known contacting units is that most contacting heads can work with only one type of wire, either aluminum or gold wire, or, when they are constructed for both types of wire, they are extremely complex.

OBJECTS OF THE INVENTION

It is, therefore, an object of the present invention to provide a contracting head which permits an easy and reliable threading of the wire, makes possible a sensitive and simple control of the wire tension, protects the wire against environmental influences, and which can be used for both aluminum and gold wire with slight changes. Also, the forces and speeds of the contacting units are to be controllable by electric signals with substantially no time loss.

Another object of the present invention is to provide a contacting head of the foregoing character which is simple in construction and may be fabricated economically.

A further object of the present invention is to provide a contacting head, as described, which may be easily maintained in service and has a substantially long operating life.

SUMMARY OF THE INVENTION

The objects of the present invention are achieved by providing that the wire guiding device is completely enclosed and, for threading the wire through the wire guiding device and through the concave contacting tool or the capillary, and for controlling the wire tension, a driving device is provided which produces a gas stream in the enclosed wire guiding device. For an electrodynamic contact pressure control of the contacting arm or horn and for a control of the gripper device or of the wire clamping device, magnetic arrangements with a permanent magnet and an aircore coil are provided.

The contacting head in accordance with the present invention achieves the following advantages: The making of wire connections on integrated circuits can be extensively automated and the resulting wire connections are of a uniform improved quality, so that the reject rate can be held low. In addition, the contacting head in accordance with the present invention can be used without major changes for both aluminum and gold wire, since a major portion of the wire guide and control system, including the wire supply spool, can be used without change for both types of wire.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

FIG. 5 shows a schematic lengthwise section through a connector for connecting a gold wire;

FIG. 6 shows a schematic lengthwise section through the driving device, the wire clamp seat, the wire clamp piston and the exit nozzle;

DESCRIPTION OF THE PREFERRED EMBODIMENTS

Figure 1:
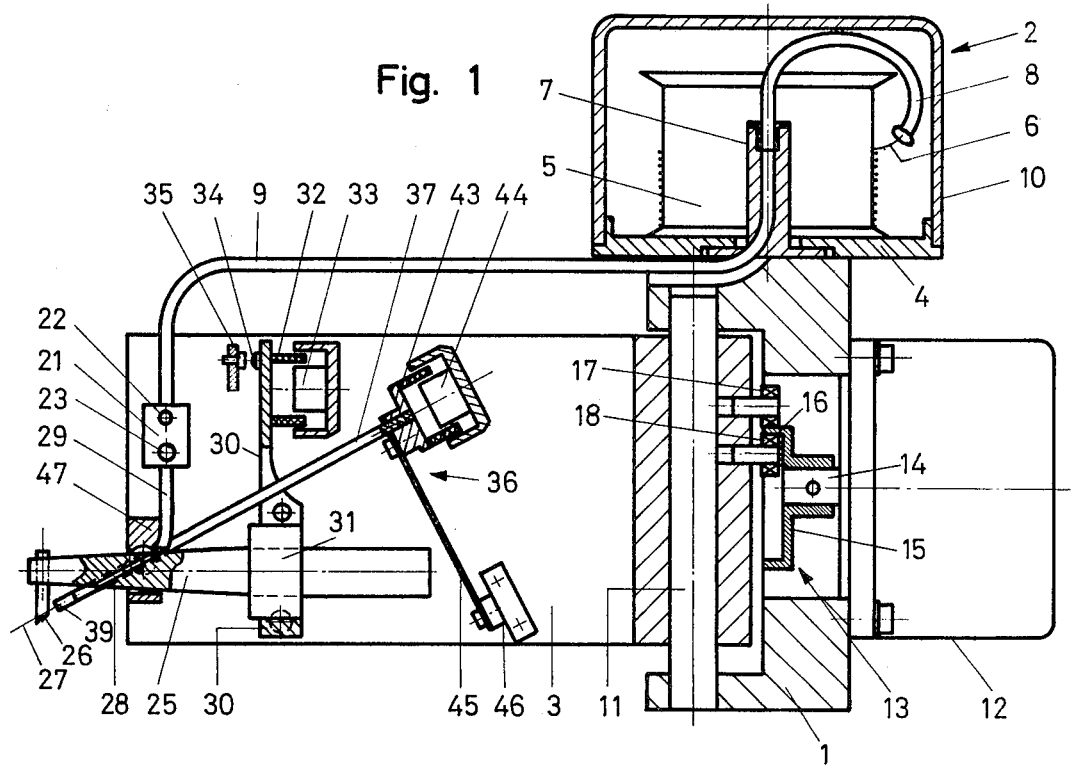
FIG. 1 shows a schematic lengthwise section taken through a connector for connecting an aluminum wire.

Referring to FIG. 1, the connector has a solid base 1 on which a wire bobbin device 2 is fastened and a connector housing 3 is located so it can be moved vertically.

The wire bobbin device 2 comprises a base plate 4 which mounts a supply bobbin 5 with wound aluminum wire 6.

A bolt 7 coaxial with the axis of the bobbin 5, is also fastened to the base 1, and has a central hole in whose upper end a tube loop 8, carrying wire 6, is mounted rotatably. The bolt has an elastic metal pipe 9 in to which the tube loop 8 discharges. The bobbin 5 and the tube loop 8 are covered by a cap 10 to protect them against dust and moisture.

The housing 3 is guided at the base 1 by a guide 11, as for example, a sliding or roller guide which allows for vertical movement of the housing. To adjust the vertical position of housing 3, there is a drive which comprises an electric motor 12 flanged to the base 1, particularly an electric stepping motor, and a mechanical positioning device 13. The latter is in form of a disk 15 fastened to shaft 14 of motor 12; this disk 15, on the side facing housing 3 has a guideway consisting of a spiral cam 16. The cam 16 lies between two rollers 17 and 18 which are rotatably mounted on housing 3. Hence, a rotary motion of shaft 14 of motor 12 displaces the rollers 17, 18 along sections of the spiral cam 16; these sections have a variable distance from the axis of the shaft 14 so that the housing moves without backlash up and down along its guide 11. By applying electrical pulses to motor 12, the vertical position of the housing can be adjusted very accurately in very small increments.

The housing 3 contains a driving device 21 which is provided for advancing the wire 6 during threading or to produce stretching of the wire and which is connected to the wire bobbin 5 via the metal tube 9 which carries wire 6. The driving device 21 has a gas entry channel 22 to which gas or air is supplied in a controlled manner, and a gas exit channel 23. An embodiment of the driving device will be described below by means of FIG. 4.

Housing 3 also contains a contact arm or horn 25 which has the form of a rod and is provided at its outer end with a known concave contacting (connecting) tool 26 to which the wire 6 is fed along axis 27. For this purpose, the contacting arm or horn 25 has a hole 28 which carries wire 6 and in which wire 6 enters from an exit nozzle (spout) 29 discharging into the hole 28. Exit nozzle 29 is part of driving device 21. A horn suspension 30 pivotably mounted in housing 3 has in its lower portion a hole 31 in which the contacting horn 25 is fastened. At the upper end of the horn suspension 50 there is a nonferrous or air core 32 which projects into the air gap of a permanent magnet 33, e.g., a ferrite magnet which is fastened to housing 3. In addition, the upper end of the horn suspension has a contact piece 34 which acts together with another contact piece 35, fastened to housing 3, depending on the vertical position of the contacting tool 26, as will be explained subsequently.

Figure 2:
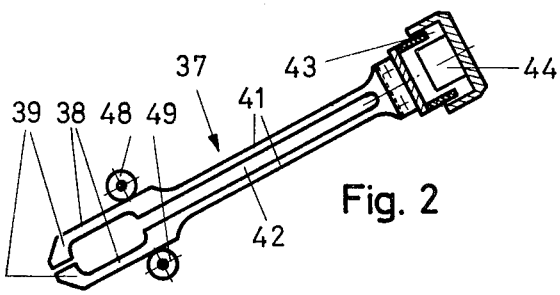
FIG. 2 shows a simplified top view of the grippers.

Finally, housing 3 contains a gripper device 36 which contains a gripper 37 of which FIG. 1 shows a side view and FIG. 2 shows a top view. The gripper has two jaws 38 whose lower jaw ends 39 are intended for gripping wire 6 running from the horn drill hole 28 to the contacting tool 26. Between the jaws 38 there is a wide slot 40 (FIG. 2) in which the contacting arm or horn 25 is located (FIG. 1); this makes possible a crossing of the gripper 37 with the contacting horn 25. Between the legs 41 of gripper 37 there is a slot 42 which makes possible a further crossing of the gripper 37 with the horn suspension 30 (FIG. 1). At its upper end, the gripper 37 has a nonferrous or air core 43 which projects into the air gap of an additional permanent magnet 44 which is rigidly mounted on housing 3. The upper end of the gripper 37 is fastened to a flat spring 45 whose lower end 46 is fastened to housing 3. The flat spring 45 causes the upper end of the gripper 37 to travel along a circular path whose radius is determined by the length of the flat spring 45. However, since the ratio of this radius to the stroke of gripper 37, caused by current flow in the core 43, is very large, and since this stroke is 0.5 mm at the most, the path of the upper gripper end may be considered rectilinear.

Figure 3:
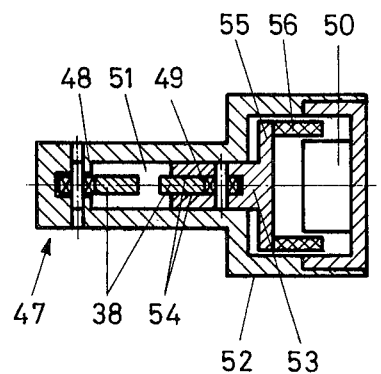
FIG. 3 shows a simplified lengthwise section through the lower gripper guideway and the gripper transverse magnet.

The bottom end of gripper 37 is located in a bottom gripper track 47 which is suggested in FIG. 1 and a section through which is shown in FIG. 3. In particular, the gripper track 47 has a roller side track formed by rollers 48 and 49. These rollers are also shown in FIG. 2. As evident from FIG. 3, this roller side track also serves as force transmission link for the forces of a gripper magnet 50 to the jaws of gripper 37. The jaws 38 transverse a lengthwise bore 51 in a housing 52 in which the one roll 48 is located as a fixed side guide for one jaw 38. The roller 49, provided as a side guide of the other jaw, is located on a member 53 sliding in the bore 51. The member 53 has two lobes 54 for the vertical guidance of this second jaw 38. A flange 55 of member 53 carries a nonferrous or air core 56 which projects into the air gap of magnet 50, also a permanent magnet, which is fastened to housing 52. By controlling the current flow through the coil 56, the wire 6 can be clamped between the jaw ends 39 (FIG. 2), or the jaw ends can be spread to facilitate easy insertion of the wire.

As already mentioned, the wire connection between the vertically movable housing 3 and the fixed base 1 passes through the elastic metal tube 9 whose bending deformation is within the limits of the elastic range. Possible horizontal positional changes are compensated by small insignificant displacements of the axis of the rotary tube loop 8 from the axis of bobbin 5.

Figure 4:
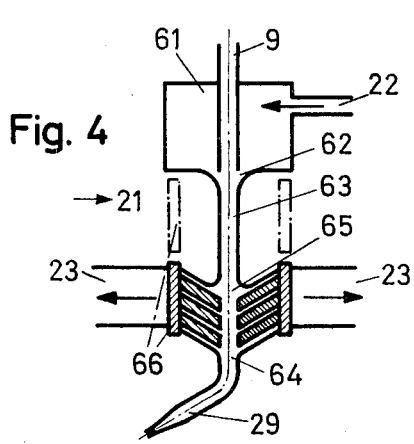
FIG. 4 shows a schematic lengthwise section through the driving device and the exit nozzle.

The driving device 21 shown in FIG. 1 is shown in section in FIG. 4 including the exit nozzle. The driving device 21 has an entry channel 22 for the gas. This channel discharges into a chamber 61 through which the metal tube 9 passes. The mouth of the metal tube 9, together with the chamber 61, forms a ring nozzle 62 which connects to a mixing tube 63. The mixing tube 63 is followed by a diffuser 64 which has at least one, and in the shown embodiment, several lateral openings that are connected to one or more exit channels 23. There also is a valve 66 by means of which the lateral openings 65 can be closed. The diffuser 64 is followed by the previously mentioned exit nozzle 29 (FIGS. 1 and 4). The mode of operation of the driving device shown is described below.

For threading an aluminum wire into the wire guide device from the wire supply bobbin 5 to the contacting tool 26, the contacting horn by means of coil 32 and magnet 33 is moved to its uppermost position in such a way that the orifice of the exit nozzle 29 comes to lie directly in the orifice of the horn drill hole 28. Then gas at high pressure is fed into the entry channel 22 of driving device 21. Through ring nozzle 62, the gas enters the mixing tube 63 at high speed, is mixed there with the air coming from the elastic metal tube 9 and the rotary tube loop 8 and forms a gas stream which, when the valve 66 is open (dot-dashed position) again leaves the driving device through the openings 65 of diffuser 64 and the exit channel 23. This gas stream sucks the wire 6 into the tube loop 8, drives it through the metal tube 9 and the driving device 21 and blows it through the horn drill hole 28 towards the contacting tool 26. The air drawn into the rotary tube loop 8 produces a reaction torque at the tube loop 8 and moves it in the direction of motion of the wire, which facilitates the motion of the wire during the threading (already described) and the unwinding of the wire from the supply bobbin 5.

During the formation of successive connections on integrated circuits by means of the threaded aluminum wire 6, the contacting tool 26 and an ultrasonic transformer (not shown in FIG. 1) located on the contacting horn 25, in a manner already known, the required wire tension can be achieved as follows. A gas, at lower pressure, is fed to the driving device 21 via the entry channel 22. The valve 66 is in the closed position shown by solid lines in FIG. 4. Due to the low rate of flow, the impulse of the gas in the mixing tube is so small that there is no suction effect. Rather, the gas, because of the low flow resistance, flows mainly into the elastic metal tube 9 and into the wire loop 8, hence against the direction of motion of the wire 6 with its intermittent feed. The gas leaving the rotating tube 8 produces a reaction torque and moves the tube loop 8 against the direction of motion of the wire, which results in an increase of the wire tension. The wire tension can be controlled continuously by controlling the pressure of the gas fed into the entry channel 22 accordingly. Hence, the gas flow in metal tube 9 and in the tube loop 8 acts as a wire brake virtually without mass. A smaller portion of the added gas flows through the capillary and thus cools the capillary which heats up during operation.

During the continuous making of wire connections on integrated circuits by means of the contacting head of FIG. 1, the contacting tool 26 is positioned in a plane (x, y plane) perpendicular to the plane of the drawing, in a manner already known, by means of a driven cross table (not shown in FIG. 1), on which the base 1 is fastened. The height adjustment (z-direction) is made by electric motor 12 and the positioning device 13.

The exertion of the contacting pressure on the aluminum wire 6 underneath the contacting tool and the connection point on the integrated circuit is effected electrodynamically by the coil 32 and the magnet 33 of the pivotable horn suspension 30; to fuse the wire to the integrated circuit, the end (inside the housing) of contacting horn 25 is equipped with an ultrasonic transformer (not shown in FIG. 1). When the contacting tool 26, upon lowering the housing 3 by means of motor 12 contacts the integrated circuit, contacts 34, 35 open and turn off motor 12. Thus, an automatic level control is achieved. The contact pressure of the contact pieces 34, 35 behaves according to the current flow in the coil 32, and according to the pressure exerted by the contacting tool 26 while contacting the integrated circuit or microcircuit.

The wire 6 is clamped by means of the jaws 39 which are electrodynamically actuated by coil 55 and magnet 50, when the second contacting of the wire connection has been made, in order to tear off the wire at an edge of the contacting tool 26 and then to advance the wire by a short distance to the first contact of the next wire connection by means of coil 43 and magnet 44.

Since the above cores 32, 44 and 56 are all nonferrous and project into air gaps of permanent magnets, there is no time loss due to magnetization and demagnetization. Also, the stroke forces and stroke speeds can be controlled electrically which contributes to the controlled automation of the making of connections on integrated circuits.

FIG. 5 shows an embodiment of the present contacting head for making connections with gold wire. The design of this contacting head is essentially the same as the contacting head for aluminum wire shown in FIG. 1. In particular, it has the base 1, the housing 3 which can be moved vertically on the base 1, and the wire bobbin device 2 located on the base. The latter is connected via the elastic metal tube 9 for guiding the wire 6 to the driving device 21. The housing 3 also contains the pivotably suspended contacting horn 25 which, however, has a capillary 71. In a known procedure for connecting with gold wire, a small ball is fused to the wire exiting from the capillary. By lowering the contacting horn with the capillary, the small ball is pressed to the point on the integrated circuit where the connection is to be made, with the capillary being heated at the same time. For this purpose, the contacting horn 25 near the capillary is equipped with a heating cartridge (not shown in FIG. 5). In order to grasp the wire, which projects after picking off the wire from the second contacted point with a small wire distance beyond the orifice of the capillary 71, to form a new wire ball in the wire track, particularly in an exit nozzle 72 of the driving device 21, a wire clamper 73 is provided instead of the gripper device of FIG. 1. This clamper has a clamping seat 74 and a clamping piston 75. The clamper piston 75 is fastened on one end of a piston rod 76, on whose other end a nonferrous core 77 is mounted. The latter, in turn, is in the air gap of a permanent magnet 78. This construction of the wire clamper also facilitates its undelayed electrical control.

As shown in FIG. 6, the same driving device 21 as in the embodiment of FIG. 1 is used. Only the construction of exit nozzle 72 is adapted to the capillary 71 and provided with the wire clamper 73. Therefore, further description of the identical units and parts, designated with the same numbers as in FIG. 1, and of the functioning and the advantages of the contacting head (connector) of FIGS. 5 and 6 are not necessary.

It is obvious that a conversion from aluminum to gold wire only requires replacing the exit nozzle 29 or 72 of the driving device 21, replacing the gripper device 36 with wire clamper 73 and contacting tool 26 by capillary 71, and possibly replacing the contacting horn 25 with its accessory heating cartridge and ultrasonic transformer.

Figure 7:
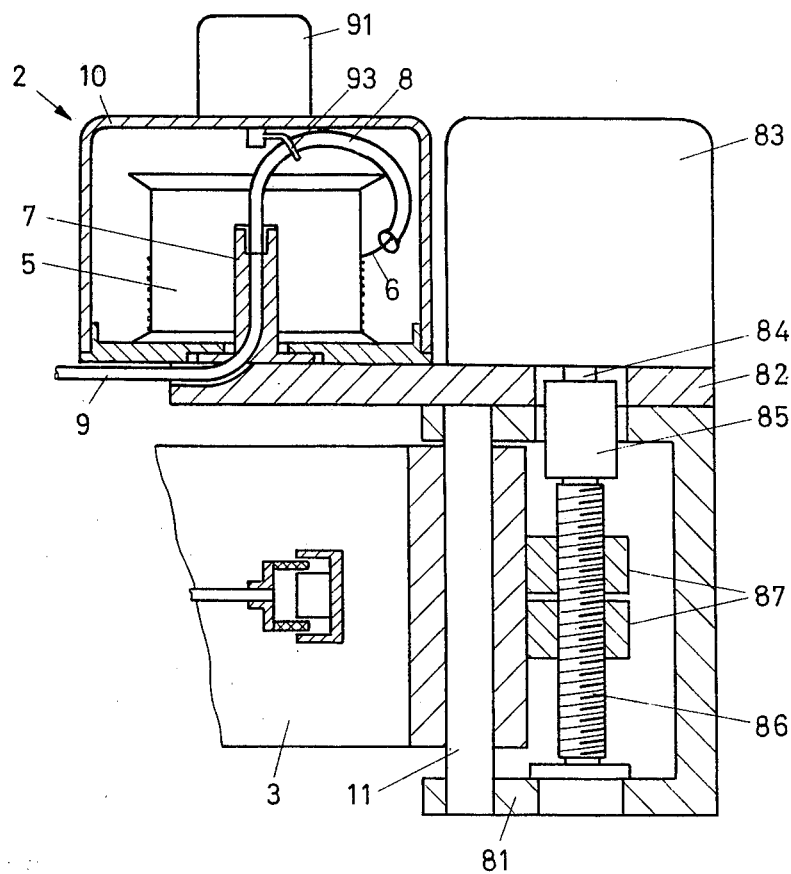
FIG. 7 shows a schematic lengthwise section through part of a variation of the connector of FIG. 5.

FIG. 7 shows a variation of the drive for setting the vertical position of housing 3 in accordance with FIG. 5. The housing 3, only part of which is shown, again travels in a guideway 1, for example, a sliding or roller guide which is located in a housing 81 serving as a base. A carrier plate fastened to the housing 81 supports an electric motor 83, particularly, an electrical stepping motor whose shaft 84 drives a worm-gear spindle 86 via a clutch 85. The worm-gear spindle 86 runs in two nuts 87 fastened to housing 3. Hence, a rotary motion of shaft 84 of motor 83 moves the housing 3 along its track 11 without backlash and upwards and downwards vibration.

The wire bobbin device 2, because of the position of motor 12, is closer to the capillary 71 than a the embodiment of FIG. 5 and it is also fastened to carrier plate 82. As with the embodiment of FIG. 5, it comprises the supply bobbin 5 with the wire 6 wound on it and the tube loop 8 mounted rotatably in the bolt 7; this tube loop discharges into the metal tube 9 through which wire 6 is fed to the driving device 21 of FIG. 5.

The drive variation shown in FIG. 7, together with the wire bobbin device can, without difficulty, be used for the contacting head for making an aluminum connection according to FIG. 1, since the remaining parts of the contacting heads of FIGS. 1 and 5 are not affected.

Figure 8:
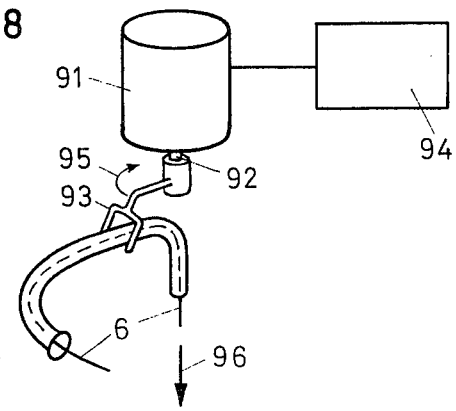
FIG. 8 shows a view of the wire stretching device shown in FIG. 7.

FIGS. 7 and 8 show a further development of the wire spool device 2 which can be used for both contacting heads of FIGS. 1 and 5. It has already been mentioned that the arrangement of the rotatably mounted tube loop 8, together with the gas flowing, opposite to the direction of motion of the wire 6, through the metal tube 9 and through the tube loop 8, forms a wire brake of virtually no mass, since the gas exiting from the tube loop 8 produces a reaction moment and moves the rotary tube loop opposite to the direction of motion of the wire and hence increases the wire tension. This increase in wire tension, controllable by the gas pressure, can be used for testing the strength of a weld after the first contacting operation, by momentarily increasing the wire tension, since the wire will be torn off the welded junction if it has sufficient strength.

It has been found that the reaction moment caused by the gas flowing through the metal tube 9 and the tube loop 8 sometimes is not sufficient to adequately increase the wire tension for testing the strength of the weld joint. Therefore, in accordance with FIGS. 7 and 8, case 10 of the wire spool device 2 has an electric torque motor 91, for example, an electric motor of constant torque whose shaft 92 mounts a fork 93 which grabs the tube loop 8. Motor 91 is connected to an electronic control 94 which is shown schematically in FIG. 8 and excites the motor 91 immediately after the first contacting operation. As a result, the tube loop 8, in addition to the reaction moment of the gas flow, receives a torque in the direction of arrow 95 in FIG. 8, and hence opposite to the torque caused by wire 6 moving in the direction of arrow 96, so that the wire tension is increased accordingly.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention, and therefore, such adaptions should and are intended to be comprehended within the meaning and range of equivalents of the following claims.

What is claimed is:

1. A contacting head for making a wire connection on an integrated circuit comprising: an encapsulated wire supply spool; wire guiding means; a contacting arm having a contacting tool and means for supplying energy thereto for forming a connection with said wire; said contacting tool having gripper means for effecting a feed or clamping of the wire during movement of said contacting arm; driving means for threading the wire through said wire guiding means and through said contacting tool and for controlling tension in said wire, said driving means producing a gas stream in said wire guiding means; and magnetic means including a permanent magnet and a nonferrous core for electrodynamic contact pressure control of said contacting arm and for control of said gripper means.

2. A contacting head as defined in claim 1 including base means supporting said encapsulated wire supply spool; a housing movable vertically on said base means and supporting said contacting arm, said driving means and said gripper means; said wire guiding means connecting said wire supply spool to said driving means and comprising an elastic metal tube for passage of the the wire.

3. A contacting head as defined in claim 2 wherein said base means includes guide means for movement of said housing comprising a spiral cam; motor means for driving said cam, said motor means comprising a stepping motor rotated at right angles to the spiral surface of the cam; and guide elements mounted on said housing and lying against said spiral cam.

4. A contacting head as defined in claim 2 wherein said base means includes guide means for movement of said housing; worm-gear means on said base means; motor means for driving said worm-gear means and comprising a stepping motor, said worm-gear means having a spindle running in nuts fastened to said housing.

5. A contacting head as defined in claim 2 including suspension means fastened to said contacting arm and pivotable on said housing; said suspension means including an electric coil with a nonferrous core; and a permanent magnet; said core projecting into an air gap of said permanent magnet for controlling the pressure of said contacting arm by current flow in said coil.

6. A contacting head as defined in claim 1, said wire guiding means including a tubular loop extending beyond said spool for unwinding the wire from said spool, said tubular loop being rotatable about the axis of said spool, the wire to be unwound from said spool being inserted into an opening of said tubular loop located outside said spool.

7. A contacting head as defined in claim 6 wherein wire guiding means further includes an elastic metal tube extending in part within said wire supply spool and connected to the interior of said tubular loop.

8. A contacting head as defined in claim 6 including a rotatable shaft; a rotary fork fastened to said shaft and engaging said tubular loop, said rotary fork being coaxial with the axis of rotation of said tubular loop; a torque motor drivingly coupled to said shaft; electronic control means connected to said torque motor so that upon excitation of said torque motor a counter torque is applied to said tubular loop for increasing the wire tension to test the strength of a wire connection.

9. A contacting head as defined in claim 1 wherein said driving means comprises a chamber with an entry channel for supplying a gas having a selectable pressure; a ring nozzle formed by a portion of said chamber, said wire guiding means including a wire supply tube connected to said spool; a mixing tube connected to said ring nozzle; a diffuser connected to said mixing tube; and a valve, said diffuser having at least one opening closable by said valve.

10. The contacting head as defined in claim 1 wherein said gripper means comprises an oblong gripper member legs with jaws, said contacting arm traveling between said jaws, said jaws having jaw ends for gripping the wire exiting from said gas driving means; suspension means for said contacting arm and running between the legs of said gripper member; said gripper member having an electrical coil with nonferrous core joining said legs for moving said gripper member in its lengthwise direction; a permanent magnet; said core projecting into an air gap of said permanent magnet; an auxiliary nonferrous core extending transversely to said gripper member; an auxiliary permanent magnet, said auxiliary core projecting into an air gap of said auxiliary permanent magent, said auxiliary core being force-linked to at least one jaw for moving said one jaw.

11. The contacting head as defined in claim 10 including a flat spring extending transversely to said gripper member and movably suspending the end of said gripper member.

12. The contacting head as defined in claim 10 wherein said gripper member has a gripper guideway at another end of said gripper member and comprising a roller side guide on both sides of said jaws, said jaws being two in number, and a vertical guide on one of said two jaws with one roller side guide being fixed and the other roller side guide being transversely movable relative to said gripper member and connected to said auxiliary core.

13. The contacting head as defined in claim 1 wherein said gripper means comprises a wire clamping member having a clamping seat and a clamping piston; an exit nozzle on said driving means and mounting said clamping seat and said clamping piston; a piston rod connected to said clamping piston; a permanent magnet with an air gap; and an electrical coil with an air core on said clamping piston and projecting into said air gap of said permanent magnet.

* * * * *